(12) United States Patent
Syau et al.

(10) Patent No.: US 6,566,236 B1
(45) Date of Patent: May 20, 2003

(54) GATE STRUCTURES WITH INCREASED ETCH MARGIN FOR SELF-ALIGNED CONTACT AND THE METHOD OF FORMING THE SAME

(75) Inventors: Tsengyou Syau, Portland, OR (US); Guo-Qiang (Patrick) Lo, Portland, OR (US); Shih-Ked Lee, Hillsboro, OR (US); Chuen-Der Lien, Los Altos Hills, CA (US); Sang-Yun Lee, Hillsboro, OR (US); Ching-Kai (Robert) Lin, Portland, OR (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/558,941

(22) Filed: Apr. 26, 2000

(51) Int. Cl.$^7$ ............................................. H01L 21/3205
(52) U.S. Cl. ...................... 438/585; 438/592; 438/595; 438/303; 438/710; 438/714; 438/647; 438/683; 257/388; 257/412; 216/2; 216/66
(58) Field of Search ................................. 438/585, 592, 438/595, 637, 644, 645, 647, 648, 649, 652, 664, 675, 683, 674, 303, 714, 738, 721, 710; 257/388, 377, 382; 156/653.1, 306, 411, 412; 216/2, 66; 365/156

(56) References Cited

U.S. PATENT DOCUMENTS

| | | | |
|---|---|---|---|
| 5,262,352 A | 11/1993 | Woo et al. .................. 437/189 |
| 5,447,887 A | * 9/1995 | Filipiak et al. ............. 438/664 |
| 5,545,578 A | * 8/1996 | Park et al. .................. 438/592 |
| 5,698,072 A | * 12/1997 | Fukuda .................... 156/653.1 |
| 5,831,899 A | * 11/1998 | Wang et al. ................ 356/156 |
| 5,989,987 A | * 11/1999 | Kuo ........................... 438/592 |
| 6,037,228 A | * 3/2000 | Hsu ........................... 438/279 |
| 6,040,241 A | * 3/2000 | Lee et al. ................... 438/632 |
| 6,146,542 A | * 11/2000 | Ha et al. ....................... 21/62 |
| 6,146,961 A | * 11/2000 | Grattinger ................. 438/396 |
| 6,214,709 B1 | * 4/2001 | Chem ........................ 438/584 |
| 6,235,621 B1 | * 5/2001 | Jeng et al. ................. 438/592 |

* cited by examiner

Primary Examiner—Matthew Smith
Assistant Examiner—Belru Keshavan
(74) Attorney, Agent, or Firm—Marger Johnson & McCollom PC

(57) ABSTRACT

A novel gate structure and a method of forming the same for a self-aligned contact on a semiconductor substrate. The method includes forming a gate oxide layer on the semiconductor substrate. Then a first conductive layer is formed on the gate oxide layer. Next, a second conductive layer, preferably a refractory metal silicide (e.g. $WSi_x$), is formed overlying the first conductive layer. A capping layer is formed overlying the second conductive layer. Then the capping layer is etched to form a patterned capping layer having a lower outside corner. An upper portion of the second conductive layer is selectively dry etched laterally to form a lateral recess under the capping layer to increase etch margin. A lower portion of the second conductive layer is then etched anisotropically down to the first conductive layer along a sidewall approximately vertically aligned with the lower outside corner of the patterned capping layer. The recess has an inward extant from the lower outside corner in a range of between 100–300 Angstroms. Increased etch margin is provided in the gate structure to prevent shorts between contact plugs and gate structures during contact formation.

28 Claims, 6 Drawing Sheets

GATE STRUCTURES WITH INCREASED ETCH MARGIN FOR SELF-ALIGNED CONTACT AND THE METHOD OF FORMING THE SAME

BACKGROUND OF THE INVENTION

1. Field of the Invention

This invention relates generally to a method of manufacturing semiconductor devices and, more particularly, to contact formation.

2. Description of the Related Art

In conventional semiconductor manufacturing, after source/drain regions are formed along a side of gate structures, an interlevel insulating layer is deposited over the resultant structure. Contact holes are then formed in the interlevel insulating layer down to the source/drain regions in order to electrically connect with the source/drain regions. Subsequently, metal is deposited to fill the contact holes for interconnection. During formation, shorts between the contact fillings and the gate structures must be prevented to avoid device failures.

In recent years, aligning contact holes between closely spaced interconnects has become a dominant impediment to ever increasing density of ULSI (ultra large scale integration) circuits. Furthermore, as modern contact lithography technology approaches its limit, forming small contact holes within alignment tolerances has become quite difficult.

To alleviate these problems, SAC (self-aligned contact) technology has been developed. U.S. Pat. No. 5,831,899 assigned to Integrated Device Technology, Inc., the disclosure of which is incorporated herein by reference, illustrates such SAC technology.

SAC technology uses a selective etching process to form contact holes. SAC technology utilizes the fact that various materials used for semiconductor fabrication, such as silicon nitride, silicon dioxide, polysilicon and photoresist each have different etch removal rates during etching. An example of conventional SAC structure is shown in FIG. 1 A. The material used for spacers 12 and/or a capping layer 14, e.g., silicon nitride, has a slower etch rate than the material used for an interlevel insulating layer 16, e.g., silicon oxide. As a result, the contact holes 18 can be defined by using an etchant that etches away predetermined regions of the interlevel insulating layer between the gate structures at a faster rate than it etches the spacers 12 and/or the capping layers 14. SAC technology thus generally enables the accurate formation of the contact holes even when the photoresist pattern defining the contact holes is not precisely aligned. During formation, the remaining amount of shoulder (shoulder remaining) or etch margin indicated as x and y in FIG. 1A, prevents shorts from occurring between contact plugs 20 and gate structures 22.

Prior SAC technology is not flawless. For example, accidental shorts can still occur between gate structures and contact plugs. Due to the limits of current selective etching processes, some amount of unwanted etching can occur in the spacers or the capping layers. When this happens, portions of the spacers or the capping layer encapsulating the gate structures are undesirably etched away. As a result, the gate structure becomes exposed to the contact plug, causing shorts between the contact plugs and the gate structures. Thus, as can be inferred from FIG. 1A, securing a sufficient shoulder remaining is critical to preventing inadvertent shorts between adjacent gate structures and contact plugs.

With the prior art gate structures and the method of manufacturing the same, however, it has not been easy to fabricate a self-aligned contact with a sufficient shoulder remaining or etch margin without using complicated and costly process steps. This is especially true today when design rules permit features sizes below 0.18 micrometers ($\mu$m).

The invention disclosed in U.S. Pat. No. 5,989,987 attempts to improve the basic SAC process by chemically etching the silicide layer using a wet etchant that is selective against a silicide to constrict the silicide layer 13 laterally. The resulting structure is shown in FIG. 1B. However, using the wet etching approach of U.S. Pat. No. 5,989,987 is subject to many process control variables and contamination, requiring a long etching time as well as subsequent cleaning steps.

Accordingly, a need remains for improved SAC technology and gate structures that provide a sufficient shoulder remaining or etch margin but use fewer and simplified process steps.

SUMMARY OF THE INVENTION

The present invention includes a novel gate structure that has an increased etch margin.

Further, the present invention provides an improved method of manufacturing a self-aligned contact with simpler and less costly process steps compared to the conventional contact processing.

In accordance with one aspect of the present invention, a method is provided for fabricating a semiconductor device on a semiconductor substrate. The method includes forming a gate oxide layer on the semiconductor substrate. Then a first conductive layer is formed overlying the gate oxide layer. Next, a second conductive layer, preferably a refractory metal silicide (e.g. $WSi_x$), is formed overlying the first conductive layer. A capping layer is formed overlying the second conductive layer. Then the capping layer is etched to form a patterned capping layer having a lower outside corner. An upper portion of the second conductive layer is selectively dry etched laterally to form a lateral recess under the capping layer to increase etch margin. A lower portion of the second conductive layer is etched anisotropically down to the first conductive layer along sidewall approximately vertically aligned with the corner.

In the present invention, a lateral recess for increasing etch margin can be formed in a portion of the second conductive layer while the gate structure is constructed. Preferably, the lateral recess is formed by dry etching, thus avoiding potentially expensive and time-consuming wet etching processes, the latter of which causes more contamination and requires additional process steps. Therefore, the present invention is simple and requires fewer process steps taking shorter process time compared to conventional processes. Manufacturing cost is reduced and yield is increased.

The foregoing and other objects, features and advantages of the invention will become more readily apparent from the following detailed description of a preferred embodiment of the invention that proceeds with reference to the accompanying drawings.

DETAILED DESCRIPTION

Figure 1A:
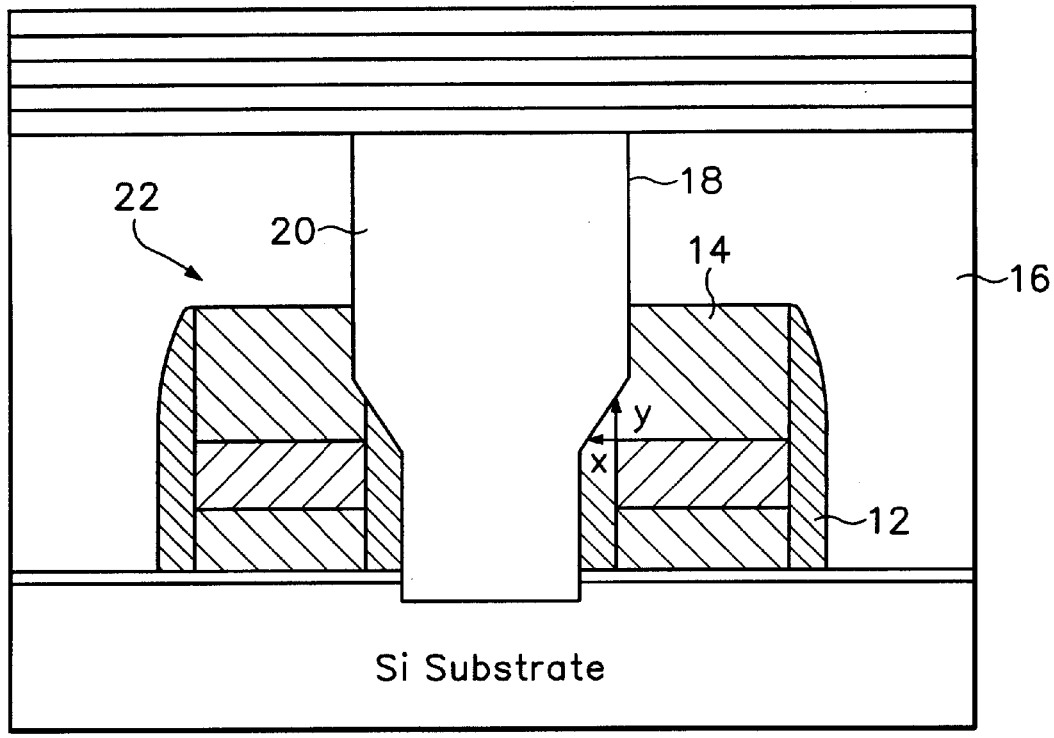
FIGS. 1A and 1B are cross-sectional diagrams of the conventional self-aligned contact structure.

FIGS. 2–11 illustrate the preferred embodiments of the present invention to increase etch margin during contact formation. This invention may be embodied in many different forms and should not be construed as limited to the embodiments set forth herein. In the drawings, it should be understood that when a layer is referred to as being ""on"" another layer or substrate, it can be directly on the other layer or substrate, or intervening layers can also be present. Well-known process steps such as forming a gate oxide layer have not been described in detail in order not to obscure the present invention.

Figure 2:
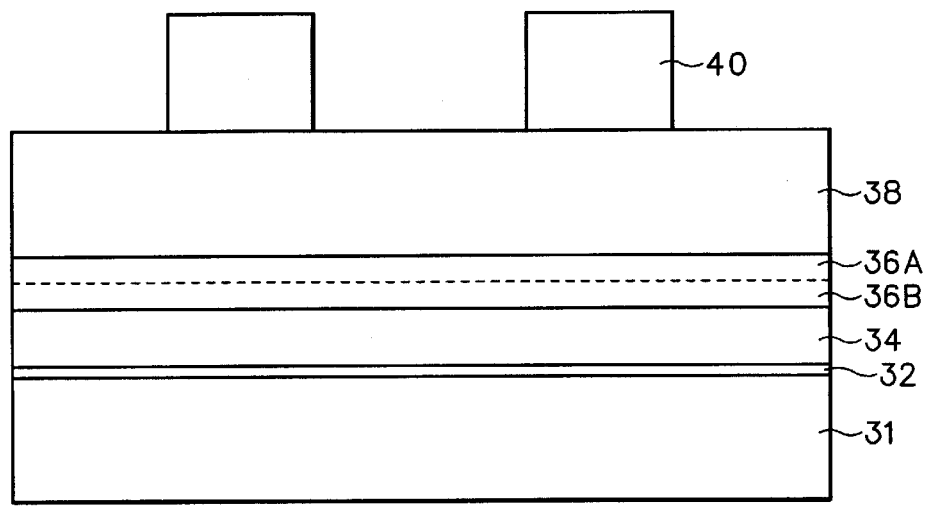
FIGS. 2–11 are cross-sectional diagrams of a semiconductor device at progressive stages of fabrication in accordance with the present invention.

As shown in FIG. 2, a gate oxide layer 32 with a thickness of 25–80 Angstroms is formed on a semiconductor substrate 31 such as a silicon substrate. A first conductive layer 34 is then formed with a thickness of 500–2000 Angstroms on the gate oxide layer 32. The first conductive layer 34 is preferably a doped polysilicon layer. Next, a second conductive layer 36 with a thickness of 400–1500 Angstroms is formed on the first conductive layer 34. The second conductive layer 36 is preferably composed of a refractory metal silicide, e.g., $WSi_x$. The second conductive layer 36 preferably comprises an upper portion or selected portion 36A and a lower portion or unselected portion 36B. Next, a capping layer 38 with a thickness of 1000–2500 Angstroms is deposited on the second conductive layer 36. Preferably, the capping layer 38 is formed of SiON, a nitride, an oxide or combinations thereof.

Figure 3:
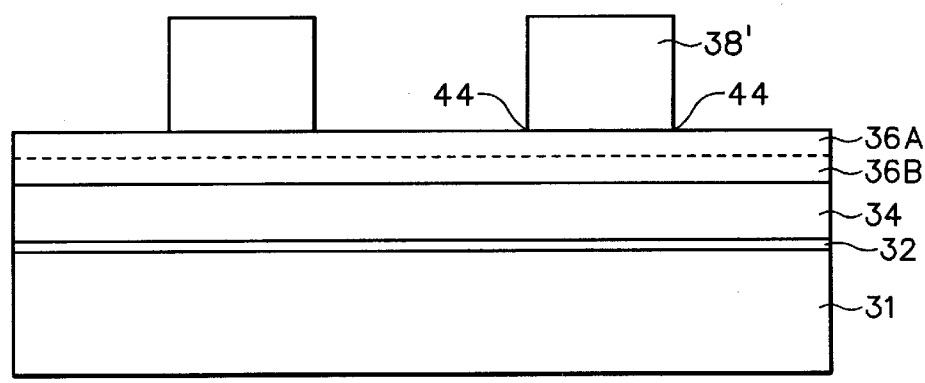

FIG. 3 shows that the capping layer 38 is etched using a photoresist pattern 40, (See FIG. 2), to form a patterned capping layer 38'. Patterned capping layer 38' serves as a hardmask to define a gate structure to be formed. The patterned capping layer 38' has a lower outside corner 44.

Figure 4A:
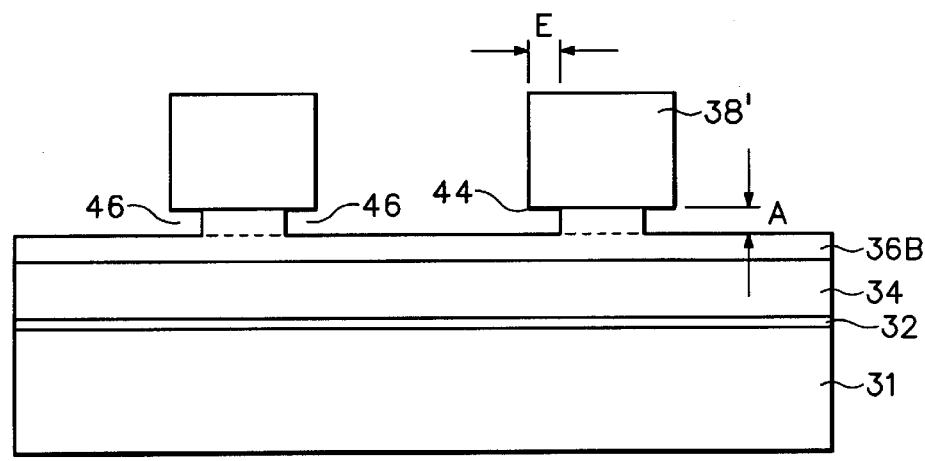

Referring to FIG. 4A, the upper portion 36A of the second conductive layer 36 is then removed, as further described below, to form a lateral recess 46 therein. Preferably, the recess 46 has an inward extent E from the lower outside corner 44 of patterned capping layer 38' in a range of between 100–300 Angstroms.

According to one embodiment of the present invention, the lateral recess 46 is formed beneath the lower outside corner 44 and extends only between the lower outside corner 44 and the lower portion 36B of the second conductive layer 36, indicated as height A in FIG. 4A.

Figure 4B:
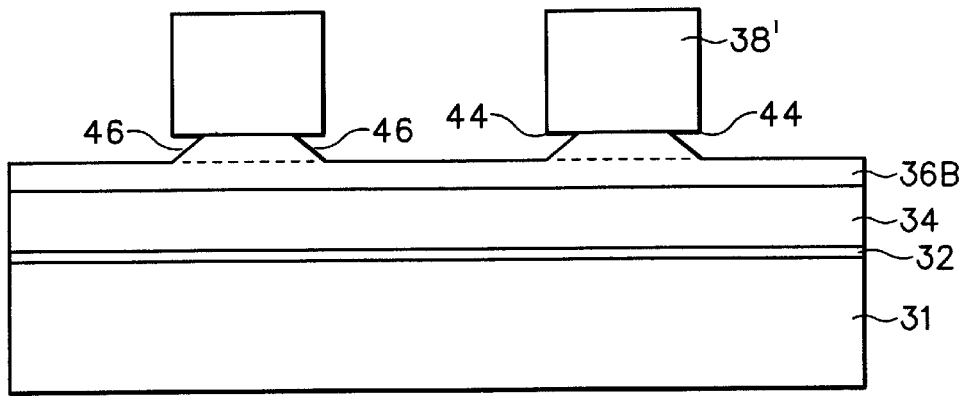

Preferably, the recess 46, in cross section, has predefined contours such as rectangular or triangular in shape, as illustrated in FIGS. 4A and 4B, respectively.

The upper portion of the second conductive layer could be removed using wet etching to form a recess therein. However, wet etching has many disadvantages such as higher cost of etchants and DI water, much longer process time, and unnecessary rinse and dry steps. Also, attempts to form a recess using wet etching during definition of a gate structure highly complicates the gate formation process. In addition, potential contamination resulting from wet etching can significantly increase the incidence of defects.

For these reasons, removing the upper portion 36A of the second conductive layer 36 to form recess 46 therein is preferably performed by dry etching such as plasma etching. Thus, the present invention using dry etching is simple with fewer process steps, less costly and thus reduces device failure probability. Example etch chemistries for producing recess 46 construction includes $SF_6$ or $CF_4$, HBr(or $N_2$, $O_2$, or $HeO_2$), and Ar. Example power is 50–500 watts, with a pressure of 2–200 mTorr. More preferably, plasma etching is performed using $SF_6$ or $CF_4$ flow of approximately 40 standard cubic centimeters per minute (sccm), at a pressure of between approximately 150 and 200 mTorr, and at approximately 50–100 Watts.

Figure 5A:
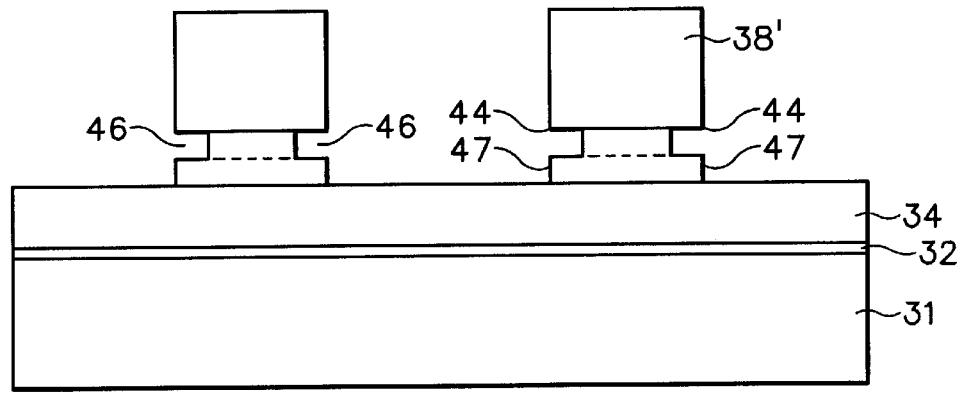
Figure 5B:
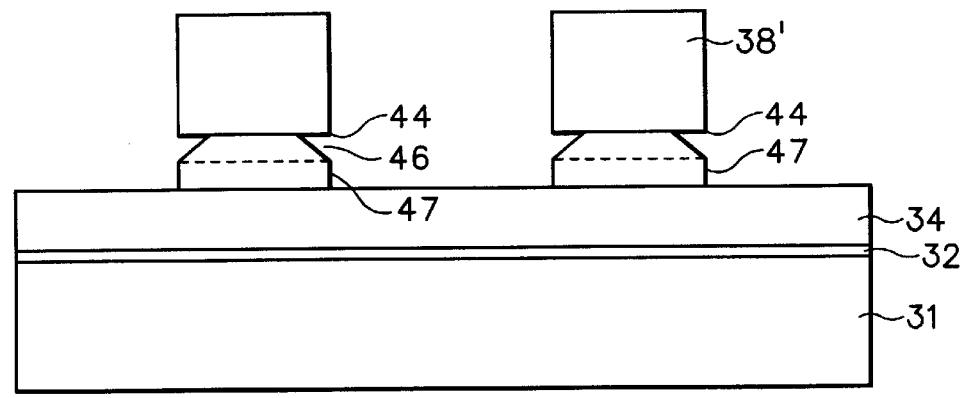

As shown in FIGS. 5A and 5B, following the formation of lateral recess 46, the lower portion 36B of the second conductive layer 36 is etched to form a sidewall 47 therein. The sidewall 47 is vertically aligned with the lower outside corner 44 of the patterned capping layer. Preferably, etching the lower portion 36B of the second conductive layer 36 is done dry etching. More preferably, dry etching is performed using $SF_6$ flow of approximately 30 sccm and HBr flow of approximately 30 sccm, at a pressure of approximately 4–30 mTorr, and at approximately 250–350 Watts.

According to one embodiment of the present invention, the process of etching the upper portion of the second conductive layer can be performed in situ with the process of etching the capping layer. Alternatively, the process of etching the upper portion of the second conductive layer is performed in situ with the process of etching the first conductive layer. Also, the process of etching the upper portion of the second conductive layer can be performed in situ with the process of etching the lower portion of the second conductive layer 36.

Figure 6A:
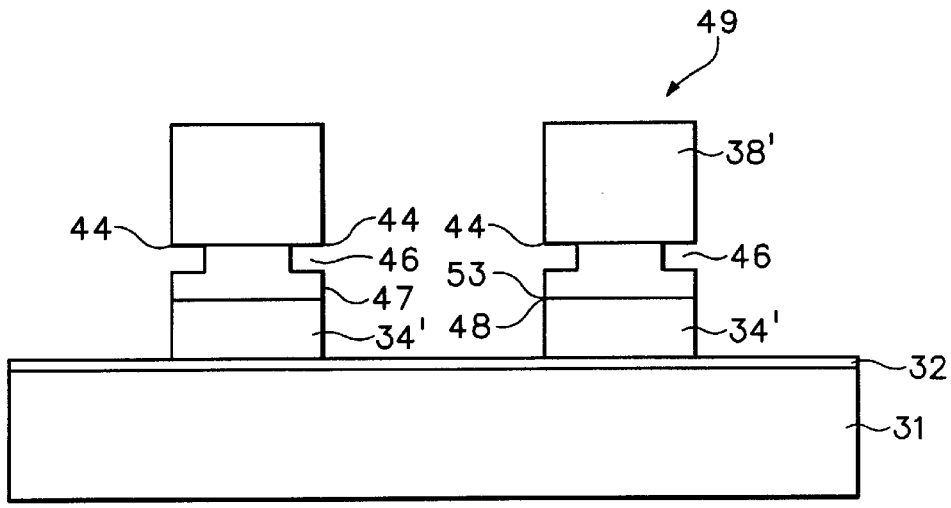
Figure 6B:
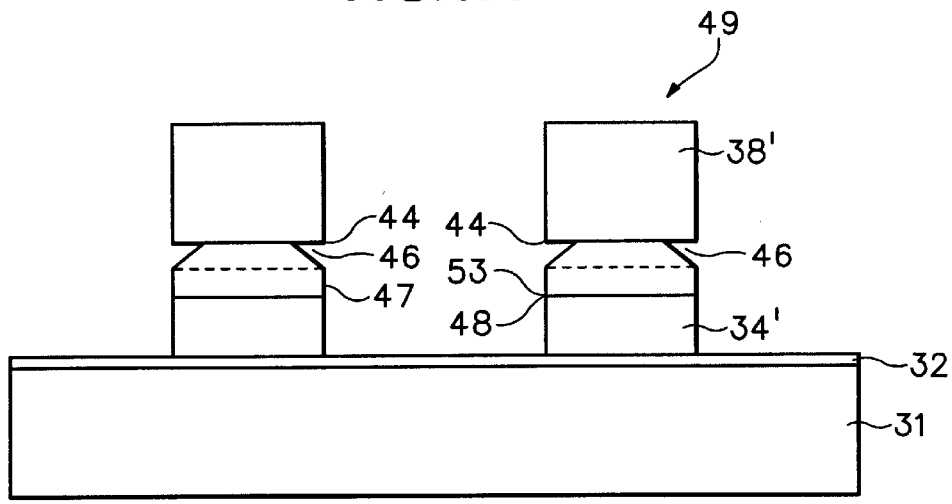

Referring to FIGS. 6A and 6B, the first conductive layer 34 is then etched to form one or more gate structures 49 with separate conductive areas 34' of the first conductive layer atop gate oxide layer 32. The lower outside corner 53 of the patterned second conductive layer can be contiguous with an upper outside corner 48 of the patterned first conductive layer 34'.

Figure 7:
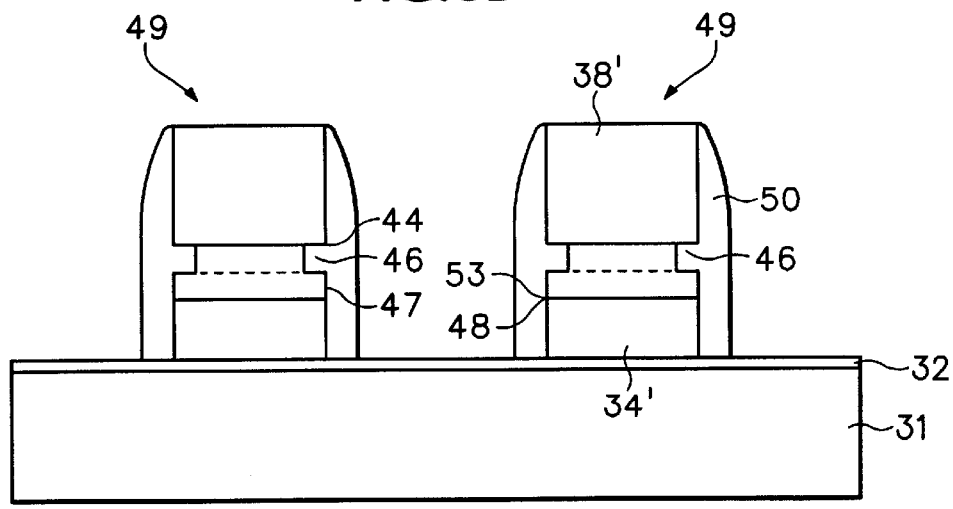

As shown in FIG. 7, sidewall spacers 50 are formed along opposite sides of the gate structure 49. In detail, an insulative film, formed of a material such as silicon nitride, is deposited and etched back to form the sidewall spacers 50. The sidewall spacers 50 substantially fill the recess 46 for electrical isolation between gate structures 49 and contact plugs to be formed. Further, the sidewall spacers 50 are used to protect the gate structure 49 from the etchants used to expose contact regions (not shown).

Figure 8:
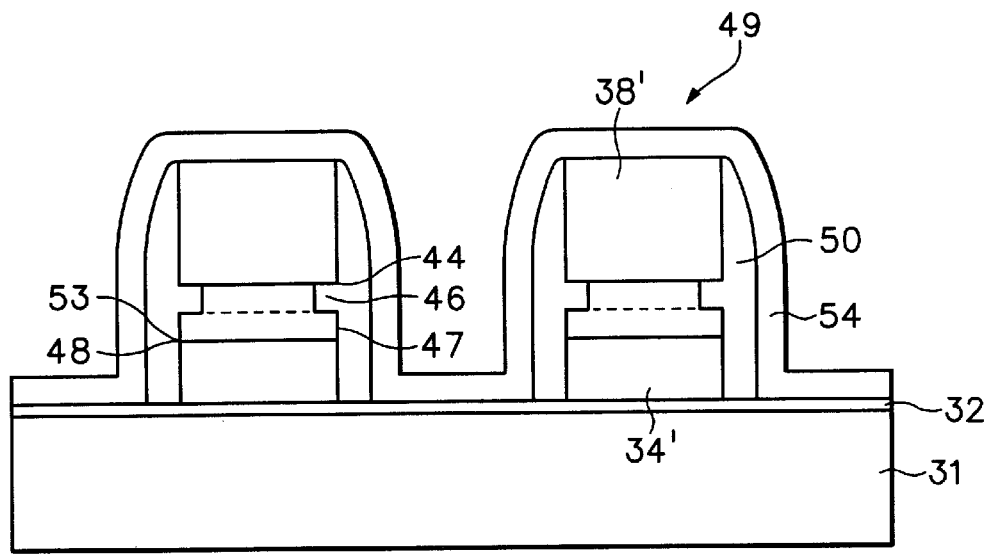

Referring to FIG. 8, a liner 54 can be formed overlying the gate structure 49 including spacers 50 prior to depositing an interlevel dielectric layer. Preferably, the liner 54 is formed of a material selected from the group consisting of nitride, SiON, oxide and combinations thereof.

Figure 9:
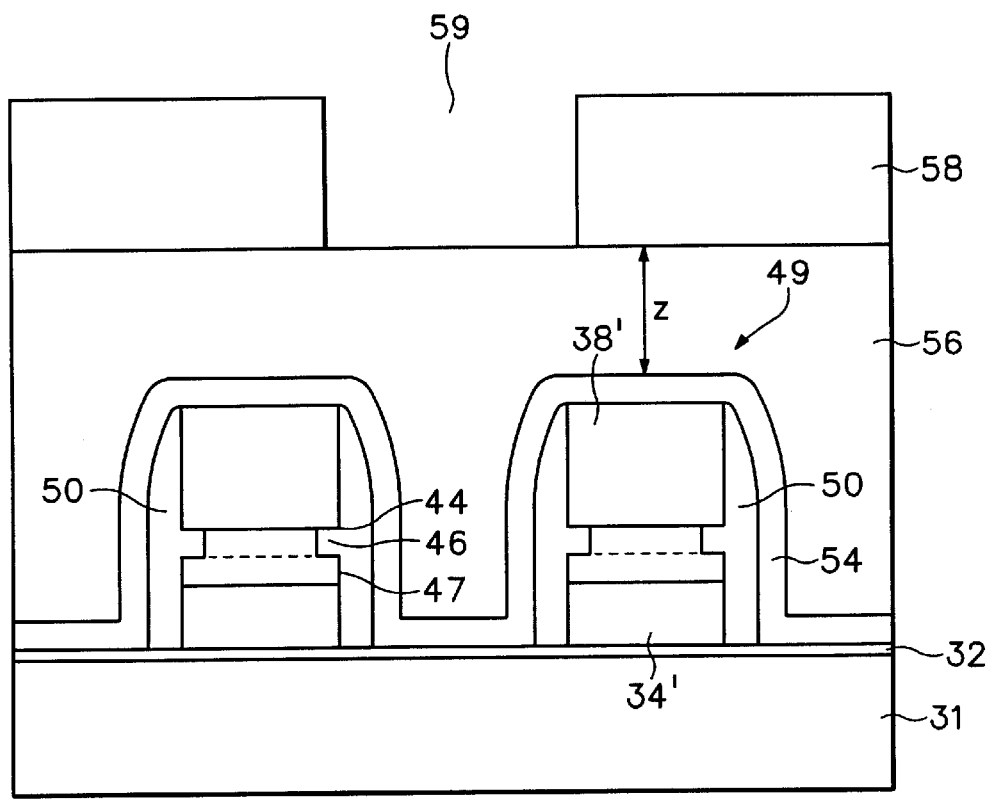

Next, as shown in FIG. 9, an interlevel dielectric layer 56 is deposited over liner 54 overlying the gate structure 49. Particularly, an insulating layer, preferably formed of a material such as a BPTEOS film, is deposited and planarized using conventional techniques, such as chemical mechanical polishing (CMP). Layer 56 has a thickness Z of 100–400 Angstroms over the gate structure 49. Then, a photoresist pattern 58 with an opening 59 for forming a contact hole is formed by photolithography. In detail, a photoresist. layer is deposited and patterned to form photoresist pattern 58 exposing the dielectric layer 56 to define a contact hole to be formed.

Figure 10:
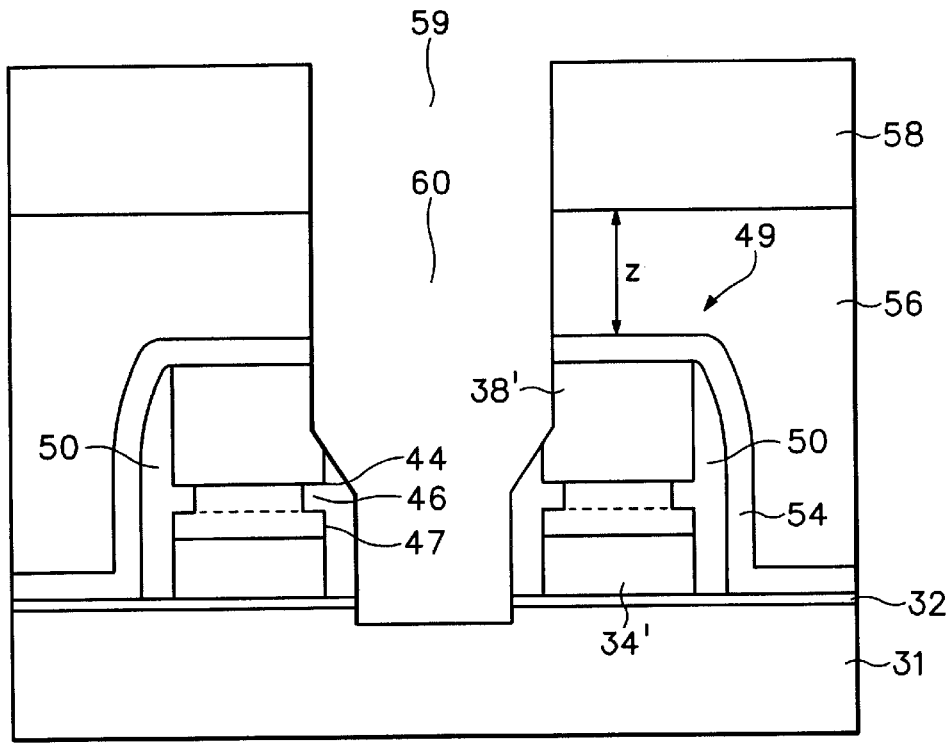

Referring to FIG. 10, the underlying interlevel insulating layer 56 is selectively etched using the photoresist pattern 58 with opening 59 to form a contact hole 60 in the interlevel insulating layer 56. Preferably, a dry etch process is performed to etch the contact hole 60 down to the silicon substrate 31. Etchants used in this process must be selective to nitrides and silicon.

Figure 11:
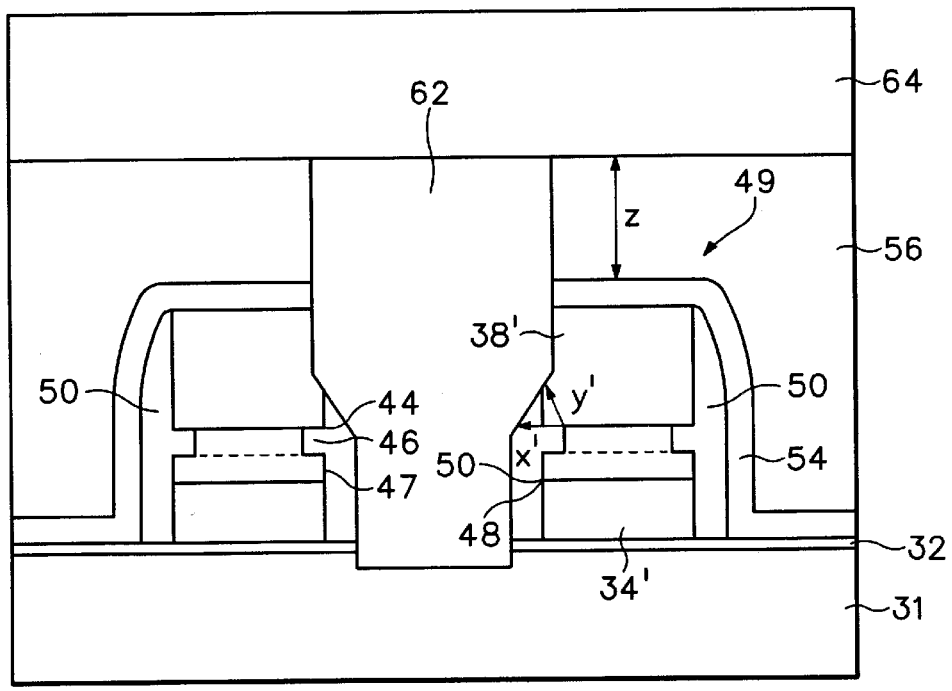

Referring to FIG. 11, following the formation of contact hole 60, metallization steps such as the formation of a contact plug 62 and conductive metal line 64 overlying contact plugs are performed using conventional techniques. FIG. 11 illustrates the contact plug 62 formed as the result of depositing conductive material in the contact hole 60.

In accordance with the present invention, the thickness or distance of "shoulder remaining" or etch margin is substantially increased from x and y (FIG. 1) to x' and y', where x'>x and y'>y. Such an increase in etch margin, for example, in accordance with the present invention, can be approximately 100—300 Angstroms in the lateral direction. Also, in the present invention, a lateral recess to increase etch margin is formed in a portion of the second conductive layer while the gate structure is constructed without additional steps being required to form the recess after the gate structures themselves are formed. In addition, the lateral recess of the present invention to increase etch margin IS formed by dry etching during gate formation, thus avoiding additional, more expensive and time-consuming wet etching and thus preventing contamination.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method of forming a gate structure for a self-aligned contact (SAC) precess, comprising:

forming a dielectric layer on a semiconductor substrate;

forming a conductive layer overlying the dielectric layer;

forming a capping layer pattern overlying the conductive layer, the capping layer pattern having a lower outside corner; and forming a lateral recess in the upper portion of the conductive layer, the recess positioned beneath the lower outside corner of the capping pattern, wherein said forming the lateral recess comprises dry etching.

2. The method of claim 1, wherein the recess in cross section is generally rectangular or triangular or triangle in shape.

3. The method of claim 1, wherein the recess has an inward extant from the lower outside corner in a range of between approximately 100–300 Angstroms.

4. The method of claim 1, wherein said dry etching is performed using $SF_6$ or $CF_4$ flow of approximately 40 sccm, at a pressure of between approximately 150 and 200 mTorr, and at approximately 50–100 Watts.

5. A method of manufacturing a semiconductor device on a semiconductor substrate, comprising:

forming a gate oxide layer on the semiconductor substrate;

forming a first conductive layer overlying the gate oxide layer;

forming a second conductive layer overlying the first conductive layer;

forming a SAC capping layer overlying the second conductive layer;

etching the capping layer to form a patterned capping layer having a lower outside corner;

removing a selected portion of the second conductive layer to form a lateral recess therein to increase etch margin and positioning the recess beneath the lower outside corner between the patterned capping layer and an unselected portion of the second conductive layer; and etching the unselected portion of the second conductive layer to form a sidewall therein and aligning the sidewall approximately vertically with the lower outside corner of the patterned capping layer.

6. The method of claim 5, further comprising:

etching the first conductive layer to form a gate structure, using the etched second conductive layer as a mask.

7. The method of claim 5, wherein the recess has an inward extant from the lower outside corner in a range of between approximately 100–300 Angstroms.

8. The method of claim 5, wherein the recess in cross section is generally rectangular or triangular in shape.

9. The method of claim 5, wherein said removing a selected portion of the second conductive layer comprises dry etching.

10. The method of claim 9, wherein said dry etching a selected portion of the second conductive layer is performed using $SF_6$ or $CF_4$ flow of approximately 40 sccm, at a pressure of between approximately 150 and 200 mTorr, and at approximately 50–100 Watts.

11. The method of claim 5, wherein said etching the unselected portion of the second conductive layer comprises dry etching.

12. The method of claim 11, wherein said dry etching the unselected portion of the second conductive layer is performed using $SF_6$ flow of approximately 30 sccm and HBr flow of approximately 30 sccm, at a pressure of approximately 4–30 mTorr, and at approximately 250–350 Watts.

13. The method of claim 5, wherein said removing a selected portion of the second conductive layer is performed in situ with said etching the capping layer.

14. The method of claim 5, wherein said removing a selected portion of the second conductive layer is performed in situ with said etching the unselected portion of the second conductive layer.

15. The method of claim 5, wherein the second conductive layer is formed of a refractory metal silicide.

16. The method of claim 5, wherein the first conductive layer is formed of polysilicon.

17. A method of forming a SAC contact, comprising:

forming a gate oxide layer on the semiconductor substrate;

forming a first conductive layer on the gate oxide layer;

forming a second conductive layer comprising a refractory metal silicide overlying the first conductive layer;

forming a SAC capping layer overlying the second conductive layer;

etching the capping layer to form a patterned capping layer having a lower outside corner;

selectively removing an upper portion of the second conductive layer to form a lateral recess therein, wherein said selective removal is performed by dry etching using $SF_6$ or $CF_4$ flow of 40 sccm, at a pressure of between 150 and 200 mTorr, and at 50–100 Watts;

etching an unselected portion of the second conductive layer to form a sidewall therein, the sidewall being approximately vertically aligned with the lower outside corner, wherein the recess only extends beneath the lower outside corner of the patterned capping layer and above the unselected portion of the second conductive layer;

etching the first conductive layer to form a gate structure;

forming a spacer along a side of the gate structure, the spacer substantially filling the recess;

depositing an interlevel insulating layer over the patterned capping layer; and selectively etching the interlevel insulating layer, thereby forming a contact hole in the interlevel insulating layer, wherein the capping layer has an etch selectivity with respect to the interlevel insulating layer.

18. A method of manufacturing a gate structure with increased etch margin on a semiconductor substrate, the substrate including a gate dielectric layer, a first conductive layer overlying the gate dielectric layer, a second conductive layer overlying the first conductive layer and having an upper portion and a lower portion thereof, the method comprising:

forming a patterned SAC capping layer overlying the second conductive layer, the patterned capping layer having a lower outside corner;

selectively dry etching the upper portion of the second conductive layer to form a lateral recess therein, the recess being inset relative to the patterned capping layer and the lower portion of the second conductive layer;

anisotropically dry etching the lower portion of the second conductive layer along a sidewall approximately vertically aligned with the lower outside corner of the patterned capping layer; and anisotropically dry etching the first conductive layer using the etched lower portion of the second conductive layer as a mask.

19. The method of claim 18, further comprising:

forming an insulative sidewall spacer extending along opposite sides of the etched second conductive layer, a portion of the sidewall spacer extending into the recess.

20. The method of claim 18, wherein the second conductive layer is formed of a refractory metal silicide and selectively dry etching the upper portion of the second conductive layer is performed using $SF_6$ or $CF_4$ flow of 40 sccm, at a pressure of between 150 and 200 mTorr, and at 50–100 Watts.

21. A gate structure for a semiconductor device with a self-aligned contact comprising:

a semiconductor substrate;

a gate oxide layer formed on the substrate;

a patterned first conductive layer overlying said gate oxide layer;

a patterned second conductive layer overlying said patterned first conductive layer; and a patterned SAC capping layer formed overlying the patterned second conductive layer, said patterned capping layer having a lower outside corner;

the second conductive layer including an upper portion and a lower portion, the upper portion defining a lateral recess inset laterally from the lower outside corner, the lower portion defining a sidewall approximately vertically aligned with the lower outside corner, the lateral recess extending only beneath the lower outside corner of the patterned capping layer and above the sidewall.

22. The gate structure of claim 21, further comprising a sidewall spacer along a side of the gate structure, a portion of the sidewall spacer extending laterally into the lateral recess above the sidewall of the lower portion of the second conductive layer.

23. The gate structure of claim 21, further comprising an insulation layer covering the first and second conductive layers and said patterned capping layer.

24. The gate structure of claim 21, wherein a lower outside corner of the etched second conductive layer is contiguous with an upper outside corner of the etched first conductive layer.

25. The gate structure of claim 21, wherein the recess in cross section is triangular or rectangular in shape.

26. The gate structure of claim 21, wherein the lateral recess has an inward extent from the lower outside corner in a range of between approximately 100–300 Angstroms.

27. A method of manufacturing a semiconductor device on a semiconductor substrate, comprising:

forming a gate oxide layer on the semiconductor substrate;

forming a first conductive layer overlying the gate oxide layer;

forming a second conductive layer overlying the first conductive layer;

forming a SAC capping layer overlying the second conductive layer, the SAC contact capping layer being formed of a material selected from the group consisting of SiON, a nitride, an oxide and combinations thereof;

etching the capping layer to form a patterned capping layer having a lower outside corner;

removing a selected portion of the second conductive layer to form a lateral recess therein to increase etch margin and positioning the recess beneath the lower outside corner between the patterned capping layer and an unselected portion of the second conductive layer; and etching the unselected portion of the second conductive layer to form a sidewall therein.

28. The method of claim 27, further comprising:

forming a spacer along a side of the gate structure, the spacer substantially filling the recess;

depositing an interlevel insulating layer over the patterned capping layer; and selectively etching the interlevel insulating layer, thereby forming a contact hole in the interlevel insulating layer, the contact hole self-aligned with the gate structure, wherein the self-aligned contact capping layer has an etch selectivity with respect to the interlevel insulating layer.

* * * * *

UNITED STATES PATENT AND TRADEMARK OFFICE
CERTIFICATE OF CORRECTION

PATENT NO. : 6,566,236 B1  
DATED : May 20, 2003  
INVENTOR(S) : Syau et al.

It is certified that error appears in the above-identified patent and that said Letters Patent is hereby corrected as shown below:

Title page,  
*Assistant Examiner*, "Belru Keshavan" should read -- Belur Keshavan --.

Figure 1B:
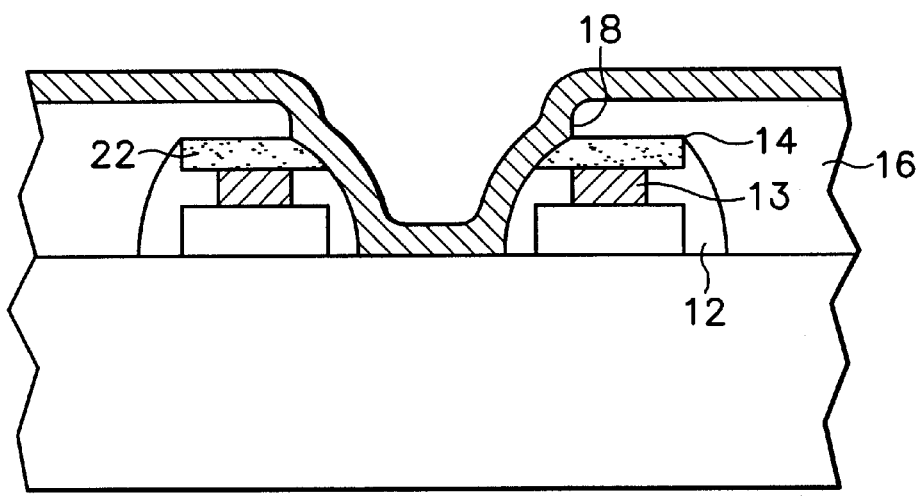

Column 1,  
Line 40, "in-Fig. 1A." should read -- in FIG. 1A. --.

Column 4,  
Line 55, "a photoresist. layer" should read -- a photoresist layer --.

Column 5,  
Line 28, "(SAC) precess, comprising:" should read -- (SAC) process, comprising --.  
Line 31, "a capping layer" should read -- a SAC capping layer --.  
Line 37, "capping pattern" should read -- capping layer pattern --.

Signed and Sealed this

Sixth Day of July, 2004

JON W. DUDAS  
*Acting Director of the United States Patent and Trademark Office*